United States Patent
Bach et al.

(10) Patent No.: US 8,044,481 B2
(45) Date of Patent: Oct. 25, 2011

(54) PHOTODIODE CHIP HAVING A HIGH LIMIT FREQUENCY

(75) Inventors: Heinz-Gunter Bach, Berlin (DE); Andreas Beling, Charlottesville, VA (US)

(73) Assignee: Fraunhofer-Gesellschaft Zur Foderung Der Angewandten Forschung E.V., Munich (DE)

( * ) Notice: Subject to any disclaimer, the term of this patent is extended or adjusted under 35 U.S.C. 154(b) by 425 days.

(21) Appl. No.: 12/090,525

(22) PCT Filed: Oct. 18, 2006

(86) PCT No.: PCT/DE2006/001866
§ 371 (c)(1),
(2), (4) Date: Aug. 27, 2008

(87) PCT Pub. No.: WO2007/045232
PCT Pub. Date: Apr. 26, 2007

(65) Prior Publication Data
US 2009/0200621 A1 Aug. 13, 2009

(30) Foreign Application Priority Data
Oct. 21, 2005 (DE) .................. 10 2005 051 571

(51) Int. Cl.
*H01L 31/0224* (2006.01)
(52) U.S. Cl. ............... 257/459; 257/E31.111; 327/514
(58) Field of Classification Search ............ 257/459, 257/466, E31.111; 327/514
See application file for complete search history.

(56) References Cited

U.S. PATENT DOCUMENTS

| 4,083,062 | A | * | 4/1978 | Ohuchi et al. | 257/438 |
| 4,963,727 | A | * | 10/1990 | Cova | 250/214 R |
| 5,461,246 | A |  | 10/1995 | Chou |  |
| 6,259,308 | B1 | * | 7/2001 | Torazawa | 327/514 |
| 6,784,430 | B2 | * | 8/2004 | Matocha et al. | 250/339.15 |

(Continued)

FOREIGN PATENT DOCUMENTS

DE 102 15 414 A1 10/2003

(Continued)

OTHER PUBLICATIONS

Beling, A. et al., "InP-Based 1.55 μm High-Speed Photodetectors for 80 Gbit/s Systems and Beyond," Proc. of 2005 7$^{th}$ Int'l Conf. on Transparent Optical Networks, Barcelona, Catalonia, Spain, pp. 303-308 (Jul. 3-7, 2005).

Goldsmith, C. et al. "Principles and Performance of Traveling-Wave Photodetector Arrays," IEEE Transactions on Microwave Theory and Techniques, IEEE Service Center 45(8) 1342-50 (Aug. 1997).

Ho, Wen-Jeng et al., "InGaAs PIN Photodiodes on Semi-Insulating InP Substrates with Bandwidth Exceeding 14 GHz," Solid State Electronics, Elsevier Science Publishers 38(7):1295-98 (Jul. 1995).

(Continued)

*Primary Examiner* — Allan R Wilson
(74) *Attorney, Agent, or Firm* — Nutter McClennen & Fish LLP

(57) ABSTRACT

The invention relates to a photodiode chip which has a great limit frequency and a junction from the active photodiode area of a photodiode mesa to the output pad of the high-frequency output of the photodiode chip. The aim of the invention is to further increase the bandwidth factor of photodiode chips. Said aim is achieved by establishing the connection from the photodiode mesa to the output pad by means of a high-resistance wire with impedance ($Z_{leitung}$) which is spread across the length thereof and is at least as high as the load impedance ($Z_{last}$) effective at the output pad.

18 Claims, 6 Drawing Sheets

U.S. PATENT DOCUMENTS

Figure 1:
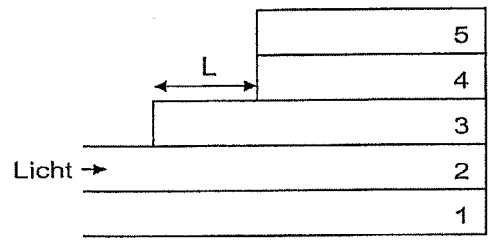

| | | | |
|---|---|---|---|
| 2003/0047752 A1* | 3/2003 | Campbell et al. | 257/186 |
| 2003/0098408 A1* | 5/2003 | Yasuoka et al. | 250/214.1 |
| 2004/0151505 A1* | 8/2004 | Aronson et al. | 398/138 |
| 2005/0121684 A1* | 6/2005 | Aruga et al. | 257/99 |
| 2006/0018669 A1* | 1/2006 | Tanaka | 398/202 |
| 2006/0151807 A1* | 7/2006 | Pardo et al. | 257/184 |

FOREIGN PATENT DOCUMENTS

| | | |
|---|---|---|
| EP | 0 367 680 A | 5/1990 |
| EP | 0 372 742 B1 | 8/1995 |
| WO | WO 94/06223 | 3/1994 |

OTHER PUBLICATIONS

International Search Report from corresponding PCT/DE2006/001866, filed Oct. 18, 2006.

Lewen R. et al., "Design of Inductive p-i-n Diode Matching for Optical Receivers with Increased Bit-Rate Operation," J. Lightwave Tech. 19(12) 1956-63 (Dec. 2001).

Wheeler, H.A., "Transmission-Line Properties of a Strip on a Dielectric Sheet on a Plane," IEEE Transactions on Microwave Theory and Techniques MTT-25(8):637-47 (Aug. 1977).

* cited by examiner

PHOTODIODE CHIP HAVING A HIGH LIMIT FREQUENCY

The invention relates to a photodiode chip of high limit frequency with a transmission line junction from the active photodiode region of a photodiode mesa to the output pad of a high-frequency output of the photodiode chip. It can thereby be advantageous, but not of necessity, to integrate jointly a terminating impedance on the chip.

For ultra-wideband photodiodes, the quantum efficiency-bandwidth product is an essential quality feature which can be planned for frequencies above 40 GHz generally only with compromises in the design (quantum efficiency vs. transit time limiting vs. RC limiting). This design compromise is particularly critical in the case of advanced integrated constructional forms of two-diode detectors (balanced detector) since here, due to the parallel connection of two photodiodes, a doubled capacitance is introduced into the RC limitation.

The compromise known for photodiodes between transit time of limited bandwidth and absorption quantum efficiency at the ever higher required operating frequency limits (10 GHz to 50 GHz) has been achieved to date in that a change has been made from the constructional form of the vertically illuminated photodiode to the laterally illuminated photodiode. Photodiodes of this type are known for example from DE 100 44 521 A1. Hence, with individual photodiodes, the frequency range of previously 15 GHz to typically 65 GHz maintaining the highest possible responsivity at 0.7 A/W was able to be developed. Above 65 GHz, even with the laterally illuminated photodiode concept, a critical compromise between efficiency and bandwidth must be adopted again both in the sub-structural forms of the waveguide photodiode and in the evanescently illuminated photodiode so that there was a requirement to look for further increases in the bandwidth capability.

The photodiodes considered here comprise a parallel integrated load impedance at the output pads, for example 50 ohm, as a result of which the signal integrity is significantly improved. This is based at the location of the photodiode on the suppression of reflections which previously were able to be reflected from a subsequent electronic system to the photodiode.

In the literature, the increase in bandwidth in photodiodes by means of so-called "inductive peaking" is well known, see Kato et al., Design of Ultrawide-Band, High-Sensitivity p-i-in Photodetectors, IEICE Trans. Electron. Vol. E76-C, No. 2, February 1993, pp. 214-221. A small inductivity is hereby connected in series (typically a bonding wire) to the capacitive current source (p-n junction of the photodiode). If this equivalent circuit feeds its electrical energy into an ohmic load resistance, the RC bandwidth, which was given without the inductivity by $1/2\pi R_{ges} C_{ges}$, can be increased relative to this RC limit by up to a factor of approx. $\sqrt{2}$ (series resonance effect). The disadvantage of this method is that the desired bandwidth increase is at the expense of a strongly non-linear phase angle rotation over the frequency, in particular in the vicinity of the upper frequency limit.

It is the object of the invention to indicate a passive photodiode circuit, the bandwidth of which in the case of simple diodes can be increased to above 100 GHz and the bandwidth of which with balanced detectors to above 70 GHz, without the responsivity dropping, i.e. without taking into account a surface or length reduction of the photodiode. The aim of the invention thereby is not only control of the frequency response of a single photodiode chip but also the reproducible adjustment of the frequency response of a detector module which contains a monolithic photodiode chip as main component.

According to the invention, the object is achieved by the features of claim 1. Expedient embodiments are the subject of the sub claims.

Accordingly, the connection from the photodiode mesa to the output pad is achieved with a high-impedance transmission line with an impedance which is distributed over the length thereof and is at least as high as the effective load impedance. The effective load impedance is for example the parallel circuit which is seen at the chip output on the part of the photodiode, comprising the chip-external load impedance (frequently at 50 ohm) and the often on-chip jointly integrated load impedance (hence likewise frequently at 50 ohm).

In a preferred manner according to the invention, the impedance of the high-impedance line is at least twice as high as the effective load impedance.

The bandwidth is increased in that, in the case of both influences limiting the bandwidths, transit time limitation and RC limitation, the RC limitation is increased in a controlled manner by an impedance-controlled line guidance from the pin mesa of the diode to the possibly resistance-loaded output pad so that the resulting total bandwidth is now dominated by the physically limiting transit time limitation. Great effort is placed thereby on maintaining a short, low-undershoot pulse response which is important for the digital signal forms of communications applications.

The basic concept is to distribute the desired amplitude increase over a larger frequency range in a moderate fashion in order to spread the non-linear phase angle of rotation over larger frequency ranges and hence also not to increase excessively the group transit time spread which is relevant for the pulse behaviour, as it is easily the case with an approach by means of a discrete RLC series oscillating circuit.

The invention therefore begins also with the basic mechanism of inductive peaking but achieves the serial inductivity which increases the frequency response not as a discrete element but uses a high-impedance transmission line—in comparison with load impedance (commonly 50 ohm)—with for example 100 to 150 ohm characteristic impedance.

The result of tests in the circuit simulator are that the desired effect which increases the signal amplitude occurs in the frequency range of the RC cut-off frequency; however a possible overshoot takes place in the frequency response in a more broadened and moderate manner so that the group transit time variation can also turn out to be smaller.

The practical achievement of the invention is assisted in the case of monolithically integrated photodiodes with a very high frequency limit 40 GHz and higher) in that the transmission line guidance is undertaken on a chip, down from the pn mesa to the output pad, no longer by means of discrete inductive elements but by means of distributed transmission line elements. Even short air bridges of a few 10 μm length down from the pn mesa to the metal plane have distributed stray capacitance elements of a few fF towards the substrate so that air bridges of this type must be described as high-impedance lines ($Z=\sqrt{L/C}$) and no longer by discrete inductivities. An L-C-distributed line can hence be formed in the simplest and most elegant form by extension of the air bridge beyond the technologically required minimum value and, in the cases of for example two-diode receivers, in which both diodes are intended to profit from the amplitude-increasing effect after bringing the electrodes thereof together, are achieved by means of a material microstrip- or coplanar line of a suitable high-impedance.

The problem resides in fact in achieving a significant frequency response course increase without however discriminating disproportionately against the pulse response as a result of too much overshooting. This is made possible by the distributed line approach in contrast to discrete production (of an individual single inductivity value) because here two optimisation parameters (impedance and line length) are available. The extent of the frequency response increase must thereby be adapted carefully to the two mechanisms acting on the photodiode chip: RC limitation (of the entire surrounding wiring) and the transit time limitation (in the p-n mesa).

The transit time limitation indicates the ultimately highest possible bandwidth which can be achieved at all if the RC limitation should be set high to quasi infinity due to arbitrary diode size reduction. A frequency response increase beyond the equivalent transit time limit frequency should therefore be avoided. However probably the total frequency response resulting from both limit influences can meaningfully be guided towards the transit limit so that the RC limit is in practice raised extensively. If this takes place with the method according to the invention which spreads the pulse energy over the frequency band by means of distributed elements, a good impulse behaviour can also be counted on in addition.

The mechanism described and tested here can be applied both to laterally illuminated photodiodes and to all constructional forms of discrete photodiodes with vertical illumination. The photodiode can be constructed thereby optionally from the p-n/p-i-n type or from the MSM (metal-semiconductor-metal) type.

Figure 2A:
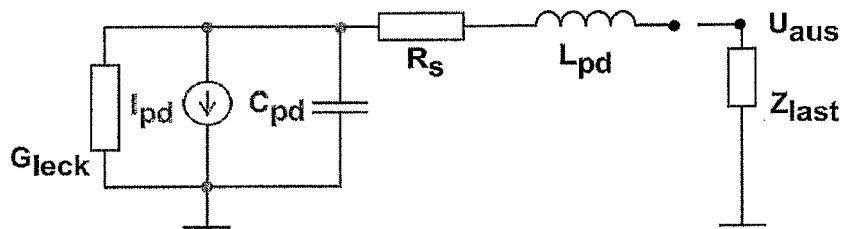
Figure 2B:
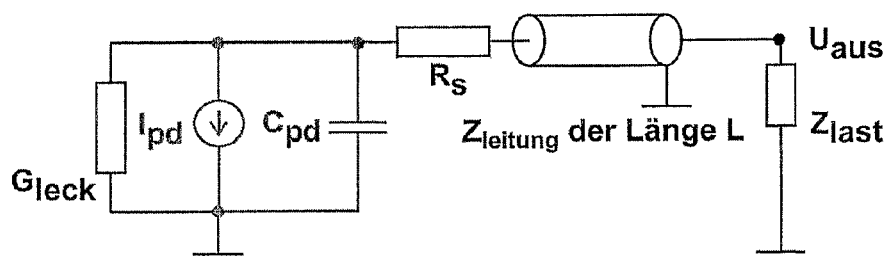
Figure 3:
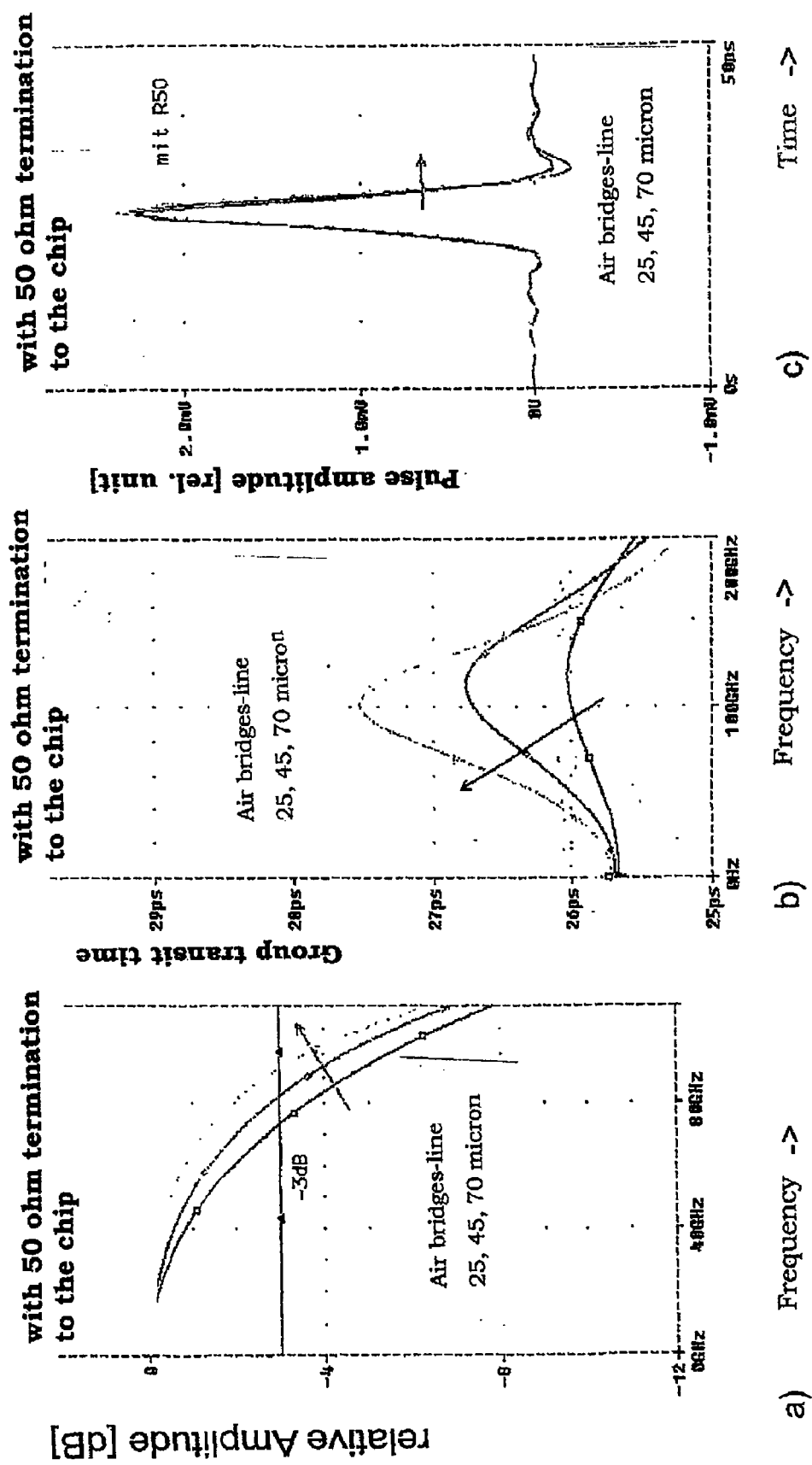
Figure 4:
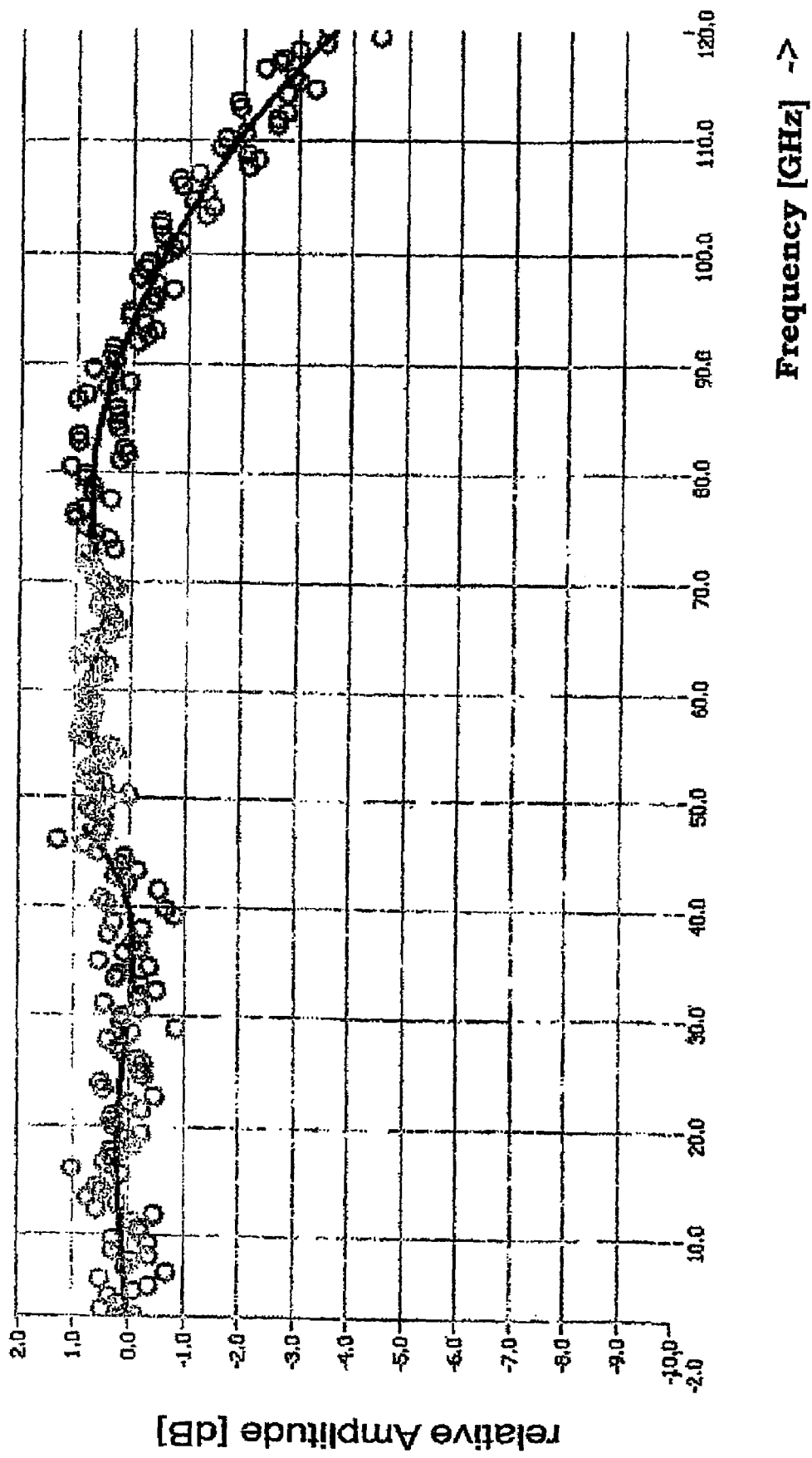
Figure 5:
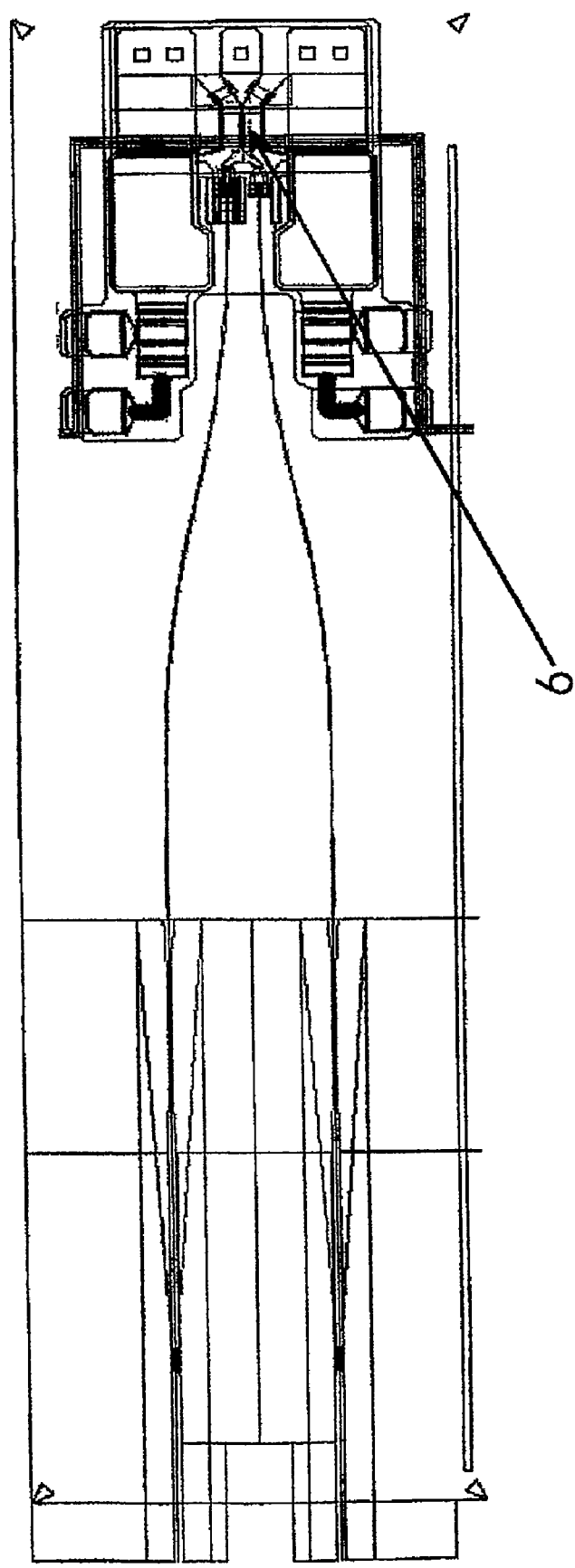
Figure 6:
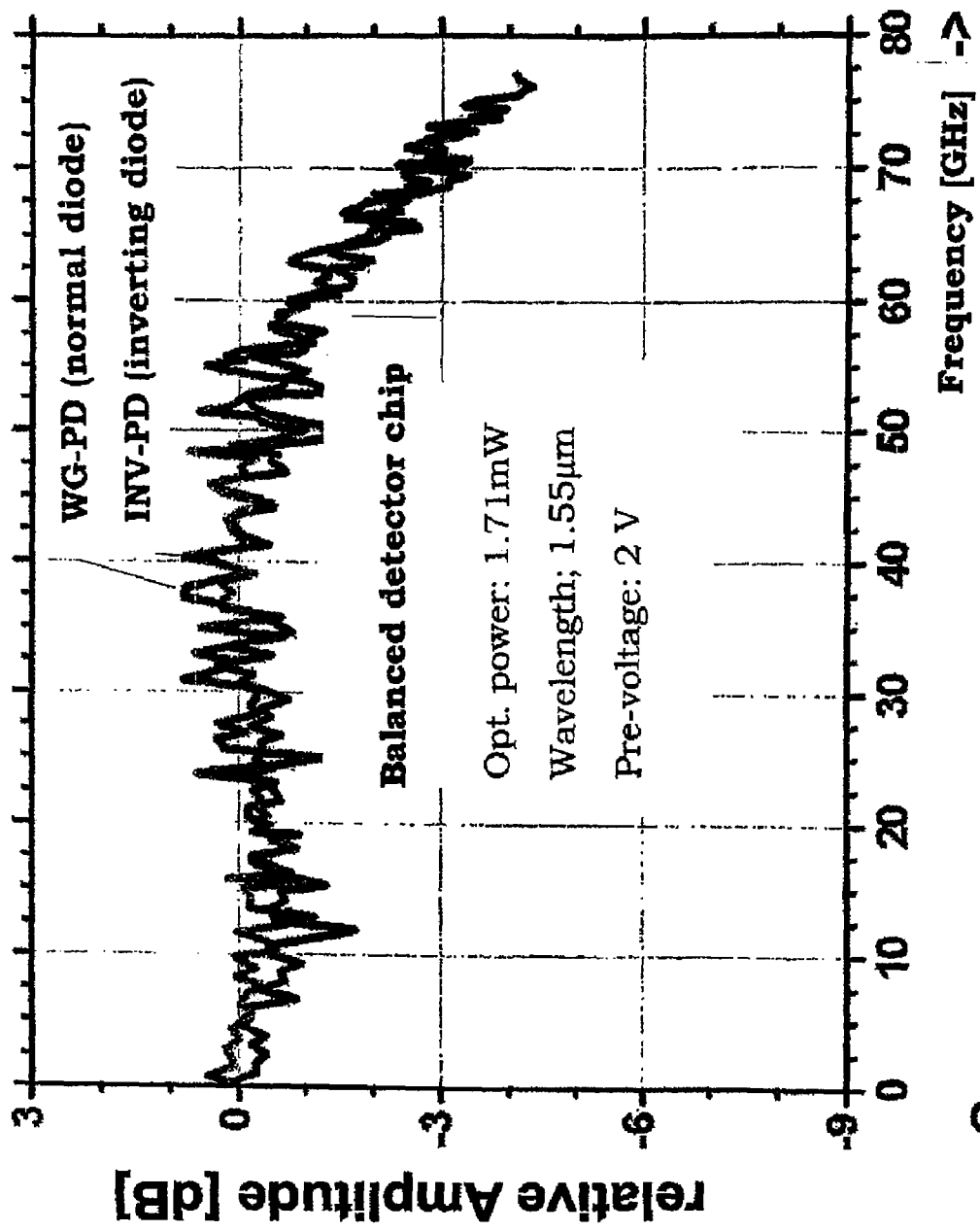
Figure 7:
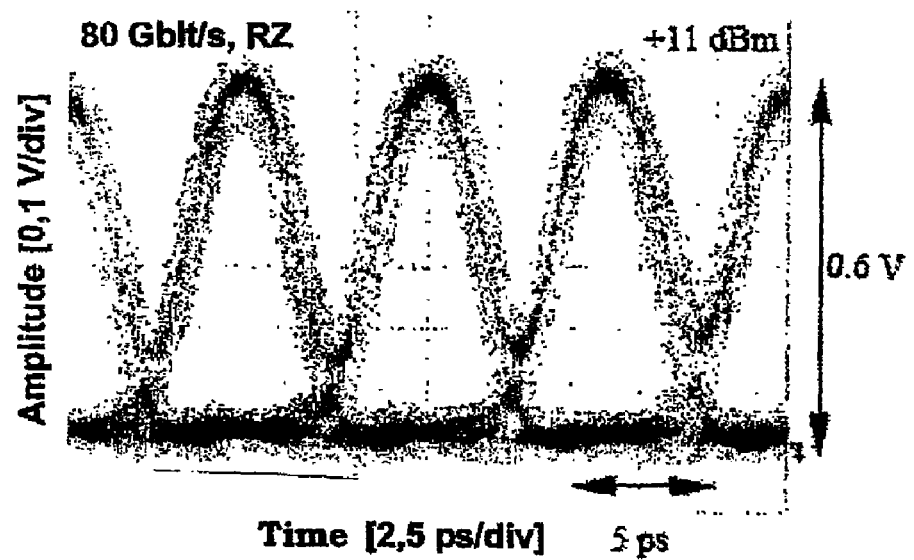
Figure 8:
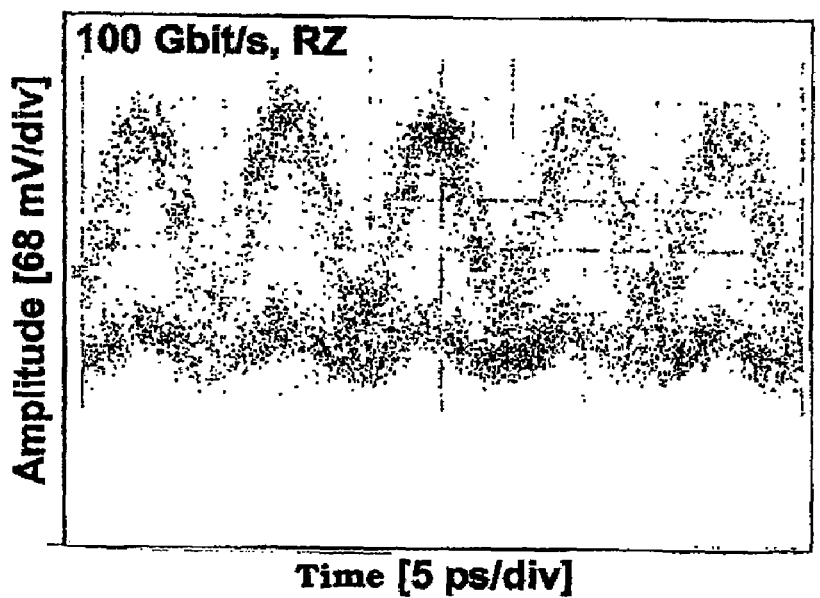

The invention is intended to be explained subsequently in more detail with reference to an embodiment of a waveguide-integrated photodiode. In the associated drawings are shown:

FIG. 1 cross-section of a schematical photodiode,

FIG. 2 the electrical equivalent circuit diagram of the photodiode with its surrounding wiring:
  a) conventional inductive peaking
  b) frequency response increase and control according to the invention by means of a short high-impedance transmission line, FIG. 3 the simulated frequency response (a), the group transit time (b) and the pulse response (c) of a p-i-n photodiode according to FIG. 2b) with variation of the air bridge line length, FIG. 4 the measured frequency response of the optoelectronic power conversion of a waveguide-integrated photodiode chip of nominal dimensions 5×20 μm$^2$, FIG. 5 a balanced photodiode chip of 70 GHz bandwidth (layout), FIG. 6 the frequency responses of the optoelectronic power conversion of a balanced photodetector chip with an electrical strip conductor layout controlled impedance by means of high-impedance coplanar line, FIG. 7 an electrical eye diagram of a detector module according to FIG. 1 at 80 Gbit/s and FIG. 8 an electrical eye diagram of a detector module according to FIG. 1 at 100 Gbit/s.

The photodiode is constructed epitaxially on an InP substrate 1 and, in this example, comprises a supply waveguide 2 and a photodiode-p-i-n-mesa based on InGaAs/InGaAsP, comprising a conductive n-contact layer 3, an absorber layer 4 and a p-contact layer 5. The absorber layer 4 of the photodiode mesa has a surface area of 5×20 μm$^2$. The thickness of the absorber layer 4 is of the order of magnitude of 350 nm. The supply waveguide 2 is a rib waveguide of 2 μm width.

The conductive n-contact layer 3 is situated between the supply waveguide 2 and the absorber layer 4. The n-contact layer 3 is extended in the direction of the supply waveguide 2 by the length L which is a few μm. In the p-contact layer 5, a plurality of p-conducting heterostructure layers including the p-metal contact layer are combined. The p-i-n-photodiode is accordingly connected externally between the p-contact layer 5 and the n-contact layer 3.

FIG. 2a shows the equivalent circuit diagram of a photodiode ($C_{pd}$, $I_{pd}$, $G_{leakage}$, $R_s$) with the known inductive peaking by means of a concentrated serial conductivity $L_{pd}$, which feeds the photodiode signal into a load impedance $Z_{load}$. The load impedance $Z_{load}$ is either identical to the external load (commonly 50 ohm) or contains the additional parallel circuit of a terminating impedance which is jointly integrated on the chip (also at 50 ohm). $U_{out}$ characterises the output voltage at the load resistor.

FIG. 2b shows the surrounding wiring according to the invention of the photodiode for controlled regulated frequency response increase by means of a short high-impedance transmission line of the impedance $Z_{line}$ and of the length L. The transmission line has a characteristic impedance of approx. 130 ohm and a length of 70 μm.

The bandwidth is increased by this measure in that with both effects which limit the bandwidth: transit time limitation and RC limitation, the RC limitation is increased in a defined manner by the impedance-controlled line from the photodiode mesa of the diode towards the 50 ohm output pad by means of an air bridge which acts as transmission line and has an increased length beyond the technologically required value (of approx. 30 μm) so that the resulting total bandwidth is now dominated by the physically limiting transit time limitation.

As a result of a circuit simulation, a frequency response increase of approx. 30 to 40% could be detected by implementing this measure, whilst maintaining a monotonically flat frequency response of the photodiode.

FIG. 3a shows the frequency response in the case of a variation of the air bridge line length of 25 μm (lowermost curve) to 70 μm (uppermost curve). The high-impedance line is hereby expressed in addition to its small parasitic stray capacitance in the fF range via the equivalent longitudinal inductivity thereof (14 pH-42 pH).

In the case of a correspondingly reduced series resistance in the 5 ohm range, a further frequency response increase up to an even higher 3 dB frequency limit of even 100 GHz is possible.

FIG. 3b shows, for clarification of the measures, the effect on the group transit time which is maintained under 2 ps spread (i.e. under 20% of the bit period of a 100 Gbit/s signal). FIG. 3c shows the pulse response of the detector, the post-pulse oscillation for the largest bandwidth remaining below 15% of the pulse maximum.

This frequency response limit could in practice be raised by moderate under-etching in the μm range of a nominally 5×20 μm$^2$ large photodiode area even up to 110 GHz (FIG. 4).

The same principle, applied to the constructional form of balanced detectors (FIG. 5), which to date have had a bandwidth of 40 to 45 GHz, led, after introduction of the impedance-controlled line guidance from the junction point of two parallel-connected photodiodes up to the 50 ohm terminating resistance via a high-impedance coplanar line 6, to an increase in the bandwidth to 70 GHz, see FIG. 6.

For verification of the outstanding electrical output pulse forms, which can be achieved by applying this chip design principle, FIGS. 7 and 8 show, with reference to a constructed detector module with a wideband photodiode chip according to FIG. 1, eye diagrams for the RZ modulation format, which were recorded at 80 Gbit/s and 100 Gbit/s. FIG. 7 shows an 80 Gbit/s RZ eye diagram at +11 dBm optical input power, converted by a photodetector module under 2.5 V reverse voltage: x-axis: 2.5 ps/div, y-axis: 100 mV/div, FIG. 8 an O/E-converted 100 Gbit/s RZ data signal with $2^{20}$-1 PRBS statistic, detected with a photoreceiver module C05-W16 and a 100 GHz oscilloscope SE100 (LeCroy) with optical RZ pulses with 2.4 ps pulse width; x: 5 ps/div, y: 68 mV/div. In both cases, a high modulation depth can be detected which testifies to the high bandwidth in the 100 GHz range also in the constructed module. Furthermore, the post-pulse oscillation effects subsequent to "ones" are small so that wide-opened eyes could be measured at both bit rates.

A comparison of the RZ eye diagrams (FIGS. 7, 8) on the completed photodiode module with the pulse response of the chip in FIG. 3c indicates that the actual photodiode module shows less overshoot occurs in the "zeros" of the RZ sequences than one could have expected from the pulse response of the chip. This favourable influence of the construction technique of the module on the pulse form is not unexpected but rather has been included already in the design of the chip. The short connection line, used in the module, between chip and the 1 mm output connector has, for its part, a small amount of damping between 0.5 and 1 dB in the frequency range up to 100 GHz. In order to compensate in advance for this damping which increases with frequency, a slightly increasing frequency response around 70 GHz was provided for the chip with the inventive measure, as the measurement in FIG. 4 shows. Together with the damping of the internal module connecting line, a monotonically gently dropping frequency response course which is intended, in the ideal case, to resemble a Bessel filter of the $4^{th}$ order, is produced for the module in order thus to achieve, for the entire system, as ideal as possible an impulse form with maximum bandwidth. Since the invention provides the frequency response control in the form of a monolithic integration on-chip, only small fabrication-related variations in the completed photodiode module can be expected since no critical bonding wire loops with exact height control are required (as in the case of known inductive peaking); even on the contrary in module construction, it is sought to implement the bonding connections always ideally short and by means of multiple bonding to be very low in inductivity since the monolithic chip which can be manufactured precisely and reproducibly lithographically is responsible for the entire frequency response control.

The invention claimed is:

1. A high frequency limit photodiode device comprising:
   a high frequency output pad having a load impedance ($Z_{load}$) acting thereon;
   a photodiode mesa having an active photodiode region; and a transmission line connecting the photodiode mesa to the high frequency output pad;
   wherein the transmission line is a high-impedance transmission line having a length and an impedance ($Z_{line}$) that is distributed over the length, and wherein the transmission line impedance ($Z_{line}$) is at least as high as the load impedance ($Z_{load}$) acting on the output pad; and
   wherein the length of the high-impedance transmission line is increased beyond a technologically required minimum value of approximately 30 μm.

2. The device of claim 1, wherein the impedance ($Z_{line}$) of the high-impedance transmission line is at least twice as high as the load impedance ($Z_{load}$).

3. The device of claim 1, wherein a parallel-connected terminating impedance is integrated jointly in the output pad on-chip for reflection reduction.

4. The device of claim 1, wherein the impedance ($Z_{line}$) of the high-impedance transmission line is produced by a stray capacitance-loaded air bridge.

5. The device of claim 1, wherein the impedance ($Z_{line}$) of the high-impedance transmission line is produced by a coplanar line.

6. The device of claim 1, wherein the impedance ($Z_{line}$) of the high-impedance transmission line is produced by a microstrip line.

7. The device of claim 5 or 6, wherein the photodiode has a planar configuration.

8. The device of claim 5 or 6, wherein the photodiode is configured in a dual-diode detector.

9. The device of claim 1, wherein the photodiode is implemented as an MSM photodiode.

10. The device of claim 1, wherein the photodiode has a high frequency limit of about 40 GHz or higher.

11. The device of claim 1, wherein the photodiode has a high frequency limit of about 65 GHz or higher.

12. The device of claim 1, wherein the photodiode has a high frequency limit of about 100 GHz or higher.

13. The device of claim 1, wherein the photodiode is configured in a dual-diode detector having a high frequency limit of about 70 GHz or higher.

14. The device of claim 1 or 2, wherein the load impedance ($Z_{load}$) is about 50 ohm.

15. The device of claim 1 or 2, wherein the impedance ($Z_{line}$) of the high-impedance transmission line is between about 100 and 150 ohm.

16. A high frequency limit photodiode device comprising:
    a high frequency output pad having a load impedance ($Z_{load}$) acting thereon;
    a photodiode mesa having an active photodiode region; and
    a transmission line connecting the photodiode mesa to the high frequency output pad;
    wherein the transmission line is a high-impedance transmission line having a length and an impedance ($Z_{line}$) that is distributed over the length, and wherein the transmission line impedance ($Z_{line}$) is at least as high as the load impedance ($Z_{load}$) acting on the output pad; and
    wherein the impedance ($Z_{line}$) of the high-impedance transmission line is at least twice as high as the load impedance ($Z_{load}$).

17. The device of claim 16, wherein the load impedance ($Z_{load}$) is about 50 ohm.

18. The device of claim 16, wherein the impedance ($Z_{line}$) of the high-impedance transmission line is between about 100 and 150 ohm.

* * * * *